US006943589B2

(12) United States Patent
Dobberphul

(10) Patent No.: US 6,943,589 B2
(45) Date of Patent: Sep. 13, 2005

(54) COMBINATION MULTIPLEXER AND TRISTATE DRIVER CIRCUIT

(75) Inventor: Daniel W. Dobberphul, Menlo Park, CA (US)

(73) Assignee: Broadcom Corporation, Irvine, CA (US)

( * ) Notice: Subject to any disclaimer, the term of this patent is extended or adjusted under 35 U.S.C. 154(b) by 924 days.

(21) Appl. No.: 09/859,194

(22) Filed: May 15, 2001

(65) Prior Publication Data

US 2002/0172232 A1 Nov. 21, 2002

(51) Int. Cl.$^7$ .............................................. H03K 19/20
(52) U.S. Cl. ...................................... 326/121; 326/106
(58) Field of Search ................................ 326/106–108, 326/112, 119, 121

(56) References Cited

U.S. PATENT DOCUMENTS

| | | | |
|---|---|---|---|
| 3,654,394 A | | 4/1972 | Gordon |
| 5,012,126 A | * | 4/1991 | Feldbaumer et al. ........ 327/410 |
| 5,243,599 A | | 9/1993 | Barrett et al. |
| 5,646,558 A | | 7/1997 | Jamshidi |
| 5,789,966 A | | 8/1998 | Bechade |
| 5,920,202 A | | 7/1999 | Young et al. |
| 6,066,978 A | | 5/2000 | Kadowaki |
| 6,081,135 A | | 6/2000 | Goodnow et al. |
| 6,087,855 A | * | 7/2000 | Frederick et al. ........... 326/106 |
| 6,118,300 A | | 9/2000 | Wittig et al. |
| 6,388,466 B1 | | 5/2002 | Wittig et al. |
| 6,522,189 B1 | | 2/2003 | Do et al. .................... 326/115 |
| 6,556,042 B1 | | 4/2003 | Kaviani |
| 6,674,671 B1 | | 1/2004 | Campbell et al. ............. 326/86 |
| 6,819,141 B1 | * | 11/2004 | Qi et al. ..................... 326/119 |

OTHER PUBLICATIONS

Tom R. Halfhill, "SiByte Reveals 64–Bit Core For NPUs; Independent MIPS64 Design Combines Low Power, High Performance," Microdesign Resources, Jun. 2000, Microprocessor Report, 4 pages.

SiByte, "Target Applications," http://sibyte.com/mercurian/applications.htm, Jan. 15, 2001, 2 pages.

SiByte, "SiByte Technology," http://sibyte.com/mercurian/technology.htm, Jan. 15, 2001, 3 pages.

SiByte, "The Mercurian Processor," http://sibyte.com/mercurian, Jan. 15, 2001, 2 pages.

SiByte, "Fact Sheet," SB–1 CPU, Oct. 2000, rev. 0.1, 1 page.

SiByte, "Fact Sheet," SB–1250, Oct. 2000, rev. 0.2, 10 pages.

Stepanian, SiByte, SiByte SB–1 MIPS64 CPU Core, Embedded Processor Forum 2000, Jun. 13, 2000, 15 pages.

Jim Keller, "The Mercurian Processor: A High Performance, Power–Efficient CMP for Networking," Oct. 10, 2000, 22 pages.

Weste, et al., "Principles of CMOS VLSI Deisgn," A Systems Perspective, Addison–Wesley Publishing Company, Jun. 1988, 5 pages.

* cited by examiner

Primary Examiner—Don Le
(74) Attorney, Agent, or Firm—Garlick Harrison & Markinson LLP

(57) ABSTRACT

A combination multiplexer and tristate circuit. A multiplexer circuit may be configured to receive at least a first data input and a second data input, which are selected by at least a first select signal and a second select signal, respectively. A first circuit is configured to provide an output to an output node responsive to the data input that is selected by the corresponding select signal being active. The multiplexer circuit may further use a tristate circuit, which is also coupled to receive the first select signal and the second select signal. If neither the first select signal nor the second select signal are active, then the tristate circuit is configured to prevent the first circuit from providing an output to the output node.

8 Claims, 3 Drawing Sheets

COMBINATION MULTIPLEXER AND TRISTATE DRIVER CIRCUIT

BACKGROUND OF THE INVENTION

1. Field of the Invention

This invention relates to complimentary metal oxide semiconductor (CMOS) circuit designs, and more particularly, to multiplexer designs.

2. Description of the Related Art

In CMOS designs, traditional static CMOS multiplexer functions may typically be implemented using two or more stages of logic (e.g. a complex gate such as an and/or function). Each stage represents a gate delay to the input data. This means that the traditional static CMOS multiplexer may be slow. This may be especially true for multiple input multiplexers.

To reduce the gate delay and slow response of some static CMOS multiplexers, it is common to use pre-charge logic to implement wide fan-in bus drivers or other large multiplexer functions. Pre-charge logic is typically used to charge an output node to a binary one, and then if the output data is a binary zero, evaluating logic pulls the output node low. The pre-charging circuitry reduces the need for multiple logic stages used in static CMOS designs. Thus pre-charging may allow for a faster output response time. However, some CMOS multiplexer designs may require a large P-Channel load device per stage, which may have a large capacitance associated with it. Additionally, in cases where pre-charge logic may not be used such as, for example, when there is no clock available or the data is not synchronous to one of the clock edges, then a static CMOS multiplexer may be the only choice. Accordingly, it is desirable to have a faster multiple input static CMOS multiplexer design.

SUMMARY OF THE INVENTION

The problems outlined above may in large part be solved by a combination multiplexer and tristate driver circuit. A multiplexer circuit may be configured to receive at least a first data input and a second data input, which are selected by at least a first select signal and a second select signal, respectively. In one embodiment, a first circuit is configured to provide an output to an output node responsive to the data input that is selected by the corresponding select signal being active. The multiplexer circuit may further use a tristate circuit, which is also coupled to receive the first select signal and the second select signal. If neither the first select signal nor the second select signal are active, then the tristate circuit is configured to prevent the first circuit from providing an output to the output node. Thus, the multiplexer circuit may be used to build larger multiplexers by instantiating the multiplexer circuit multiple times.

Broadly speaking, in one embodiment, a multiplexer circuit is contemplated comprising a first circuit coupled to receive at least a first data input and a second data input. The first circuit is also coupled to receive at least a first select signal and a second select signal corresponding to the first data input and the second data input, respectively. The first circuit is coupled to an output node and is configured to provide an output on the output node responsive to a corresponding one of the first select signal or the second select signal being active. The multiplexer circuit may also include a tristate circuit coupled to receive the first select signal and the second select signal. The tristate circuit is also coupled to the first circuit. The tristate circuit is configured to prevent the first circuit from providing an output on the output node responsive to the first select signal and the second select signal being inactive.

In an alternative embodiment, a multiplexer circuit comprising a first multiplexer circuit is coupled to a first data input and a second data input. The first multiplexer circuit is also coupled to a first select signal and a second select signal corresponding to the first data input and the second data input, respectively. The first multiplexer circuit is configured to provide an output on an output node responsive to a corresponding one of the first select signal or the second select signal being active and to provide no output on the output node responsive to the first select signal and the second select signal being inactive. The multiplexer circuit may also include a second multiplexer circuit coupled to a third data input and a fourth data input. The second multiplexer circuit is also coupled to a third select signal and a fourth select signal corresponding to the third data input and the fourth data input, respectively. The second multiplexer circuit is configured to provide an output on the output node responsive to a corresponding one of the third select signal or the fourth select signal being active and to provide no output on the output node responsive to the first select signal and the second select signal being inactive.

In addition, a method of operating a multiplexer circuit is contemplated. In one embodiment, at least a first data input and a second data input are received by the multiplexer circuit. Additionally, at least a first select signal corresponding to the first data input and a second select signal corresponding to the second data input are also received by the multiplexer circuit. The multiplexer circuit provides an output on an output node responsive to a corresponding one of the first select signal or the second select signal being active. The multiplexer provides no output on the output node responsive to the first select signal and the second select signal being inactive.

BRIEF DESCRIPTION OF THE DRAWINGS

Other objects and advantages of the invention will become apparent upon reading the following detailed description and upon reference to the accompanying drawings in which.

Figure 1:
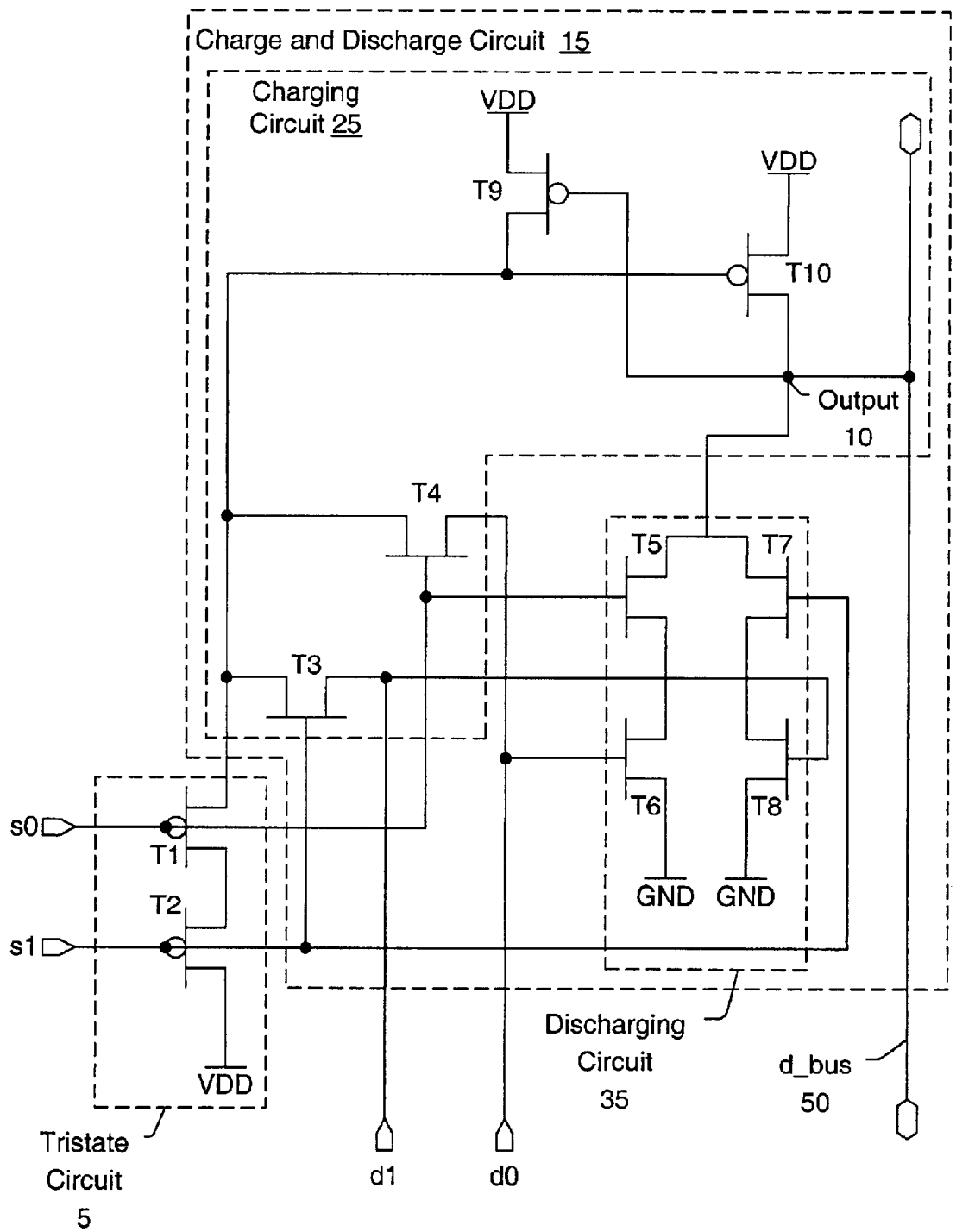
FIG. 1 is a circuit diagram of one embodiment of a two input multiplexer.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to FIG. 1, a circuit diagram of one embodiment of a two input multiplexer is shown. The multiplexer circuit illustrated in FIG. 1 includes ten transistors, four of which are P-channel CMOS transistors and six are N-channel CMOS transistors. A P-channel transistor T1 is connected in series with another P-channel transistor T2. One end of the series connection is connected to a positive power supply voltage VDD. The other end of the series connection is connected to the gate terminal of a P-channel transistor T10. The gate terminal of transistor T1 is connected to select signal s0 and the gate of transistor T2 is connected to select signal s1.

The select signals s0 and s1 are also connected to the gates of an N-channel transistor T4 and an N-channel transistor T3, respectively. Transistors T3 and T4 are connected in parallel such that their output terminals are connected together. The input terminal of transistor T4 is connected to a data input signal d0 and the input terminal of transistor T3 is connected to a data input signal d1.

An N-channel transistor T5 is connected in series with an N-channel transistor T6. An N-channel transistor T7 is connected in series with an N-channel transistor T8. The two series pairs of transistors are connected in parallel such that the output of transistor T5 and the output of transistor T7 are connected together. This connection is an output node 10. The other ends of the series connections are both connected to a circuit ground GND. The gate terminal of transistor T5 is connected to select signal s0 and the gate terminal of transistor T7 is connected to select signal s1. The gate terminal of transistor T6 is connected to data input signal d0 and the gate terminal of transistor T8 is connected to data input signal d1.

One terminal of transistor T10 is connected to VDD, while the other terminal is connected to output node 10. Output node 10 is also connected to the gate terminal of a P-channel transistor T9. One terminal of transistor T9 is connected to VDD while the other terminal is connected to the gate of transistor T10. Output node 10 may also be connected to a data bus d_bus 50.

The multiplexer circuit may be thought of as having two main sub-circuits: a charge and discharge circuit 15 and a tristate circuit 5. Charge and discharge circuit 15 is configured to charge or discharge output node 10 (thus providing a binary one or binary zero output, respectively) responsive to an active select signal and the data on the corresponding data signal. More particularly, charge and discharge circuit 15 may charge the output node 10 (providing a binary one) responsive to a selected data input being binary zero, and may discharge the output node 10 (providing a binary zero) responsive to a selected data input being a binary one. In other words, charge and discharge circuit 15 may provide an inverting multiplexing function. Other embodiments may provide a non-inverting multiplexing function.

In the illustrated embodiment, charge and discharge circuit 15 may include two subcircuits: A charging circuit 25 that includes transistors T3, T4, T9 and T10 and a discharging circuit 35 that includes transistors T5, T6, T7 and T8. Charging circuit 25 charges output node 10 to VDD (a binary one) responsive to data present on the data input if the corresponding select signal is active. More particularly, charging circuit 25 charges output node 10 responsive to a binary zero on the selected data input. Discharging circuit 35 discharges output node 10 to GND (a binary zero) responsive to data present on the data input if the corresponding select signal is active. More particularly, discharging circuit 35 discharges output node 10 responsive to a binary one on the selected data input.

Tristate circuit 5 includes transistor T1 and transistor T2. Tristate circuit 5 prevents charge and discharge circuit 15 from providing on output on output node 10 if neither of the select signals are active. More particularly in the illustrated embodiment, tristate circuit 5 causes VDD to be applied to the gate of transistor T10 when neither of the select signals are active. Thus, transistor T10 is off. When neither select signal is active, the series transistor connections T5/T6 and T7/T8 are off as well, preventing discharge of the output node 10. Accordingly, output node 10 may be floating when neither of the select signals are active.

The embodiment in FIG. 1 is shown using CMOS transistors. It is contemplated that other embodiments may use any suitable set of transistors that may be manufactured in technologies other than CMOS.

As noted above, this embodiment illustrates a two input multiplexer. This particular embodiment has two select signals s0 and s1 that control which data input is selected as the output. One of the data input signals is selected by activating the corresponding select line. In this embodiment an active signal refers to a binary one, and conversely, an inactive signal refers to a binary zero. It is noted that in other embodiments, an active signal may be a binary zero, while an inactive signal may be a binary one. It is also noted, that while this embodiment illustrates a two input multiplexer, it is contemplated that other embodiments may be N input multiplexers. For example, a four input multiplexer is illustrated below.

The operation of the multiplexer circuit shown in FIG. 1 will next be described. First, operation will be described for data input signals d0 and d1 being a binary zero (represented by a GND voltage level). To select data input d0, a binary one (represented by a VDD voltage level) is input on select signal s0 and a binary zero is input on select signal s1. In this example, the binary zero on s0 causes transistor T1 not to conduct (referred to as being "off" or in an "off state"), while transistor T2 is conducting (referred to as being "on" or in an "on state"). The binary one on select signal s0 is also applied to the gates of transistor T4 and transistor T5, causing both to turn on. The binary zero on data input d0 is applied to the gate of transistor T6, which is therefore off. Accordingly, the series connection of transistors T5 and T6 does not discharge output node 10. Since transistor T4 is on, the binary zero on data input d0 is passed through transistor T4 to the gate of transistor T10, causing it to turn on. Transistor T10 charges output node 10 (and therefore d_bus 50) to VDD. Thus the binary zero input on data input d0 is inverted and a binary one is present at output node 10. In other words, in this embodiment, the multiplexer is an inverting multiplexer. Other embodiments may be non-inverting, (e.g. by adding an inverting stage at output node 10). The binary one on output node 10 is also applied to the gate of transistor T9, which is therefore off.

With the select signals s0 and s1 the same as above, operation will now be described for data input d0 being a binary one. The signal path that the data follows is the same as above. However, the result is different. A binary one passes through transistor T4 to the gate of transistor T10, which causes transistor T10 to turn off. The binary one is also applied to the gate of transistor T6, turning it on. Since transistor T5 is on due to select signal s0, the series connection of transistors T5 and T6 discharges output node 10 to GND. Thus the binary one present on data input d0 is inverted to a binary zero at output node 10. As output node 10 approaches ground, or a binary zero, transistor T9 turns on and causes VDD to be applied to the gate of transistor T10, thereby assuring that transistor T10 is in the off state.

Operation of the multiplexer circuit when select signal s0 is deactivated and select signal s1 is active is similar to the above description, with transistor T7 corresponding to transistor T5, transistor T8 corresponding to transistor T6, and transistor T3 corresponding to transistor T4.

Next, the case when neither select signal s0 nor s1 are active is described. Both transistor T1 and transistor T2 are on, charging the gate of transistor T10 to VDD. The binary zeros present on both select signal s0 and s1 are applied to the gates of transistors T3, T4, T5 and T7, turning them off. Turning off transistors T3 and T4 prevents the data present on data input d0 and d1 from passing to the gate of transistor T10. Turning off transistors T5 and T7 prevents discharging of output node 10 to GND. In this way, output node 10 is allowed to "float", which is also referred to as being in tristate. Since the impedance seen by any load that may be attached to d_bus 50 looking into output node 10 is high, it is also referred to as a high impedance state. This tristate feature will be described in more detail below.

Figure 2:
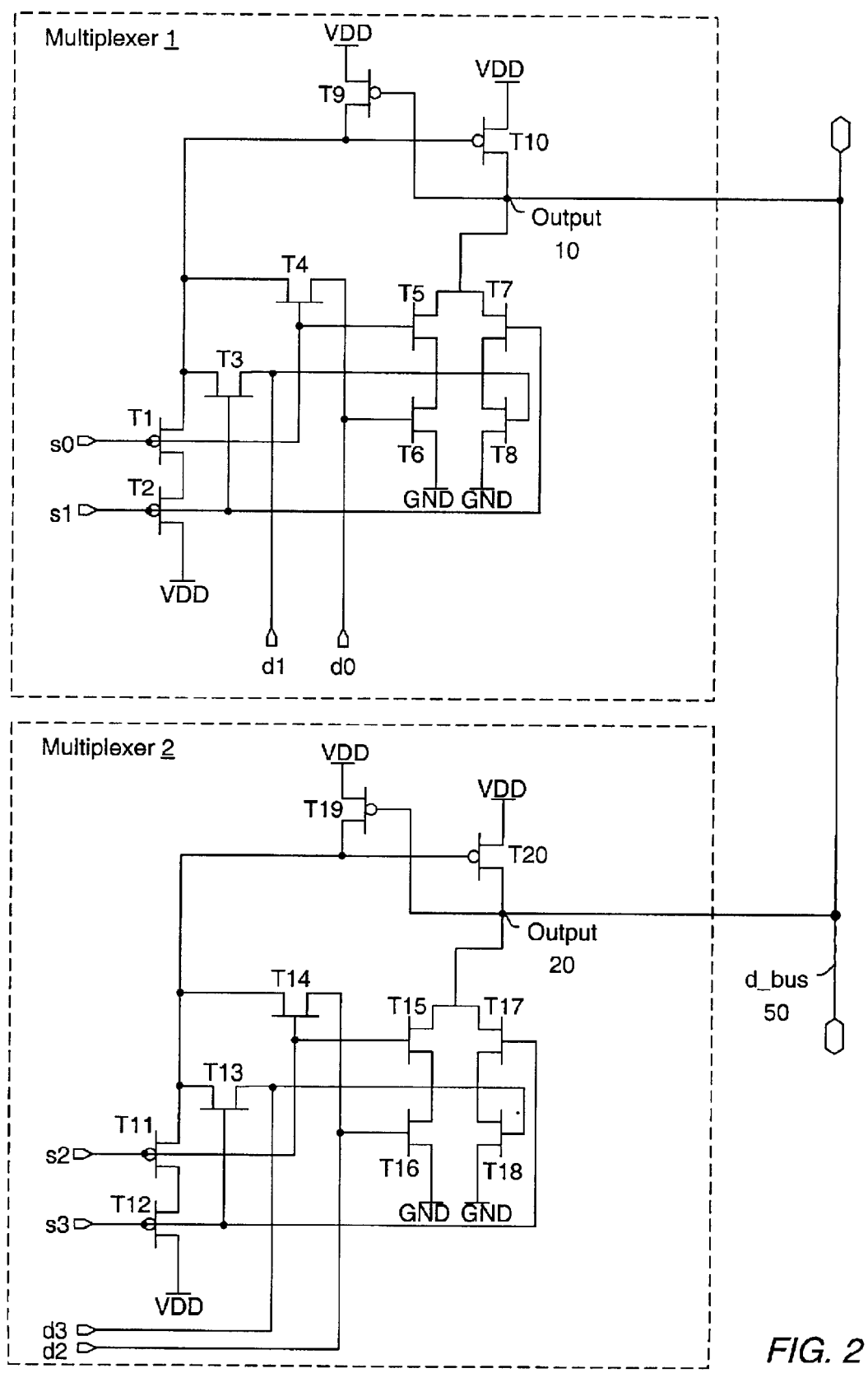
FIG. 2 is a circuit diagram of one embodiment of a four input multiplexer circuit.

Referring to FIG. 2, a circuit diagram of one embodiment of a four input multiplexer circuit is illustrated. The four input multiplexer shown in FIG. 2 includes a first two input multiplexer circuit, multiplexer 1 and a second two input multiplexer, multiplexer 2. The output nodes of multiplexer 1 and multiplexer 2 are connected in parallel such that an output node 10 of multiplexer 1 and an output node 20 of multiplexer 2 are both connected to d_bus 50. The four data input signals are d0, d1, d2, d3 and the four corresponding select signals are s0, s1, s2, s3, respectively.

Both multiplexer 1 and multiplexer 2 are instantiations of the multiplexer circuit of FIG. 1. The tristate circuit described above in the description of FIG. 1 enables multiple two input multiplexers to be connected to a common output node by causing each multiplexer output node to be placed in a high impedance state when neither of the respective multiplexer select lines is active. For example, in FIG. 2, if select signal s2 is active, then s0, s1 and s3 are inactive. This places output node 10 of multiplexer 1 in a high impedance state allowing multiplexer 2 to drive data onto d_bus 50 without bus contention. The high impedance state of the inactive multiplexer allows the basic two input multiplexer of FIG. 1 to be instantiated N times to produce a 2N input multiplexer. The ability to instantiate the basic multiplexer may also provide circuit layout efficiency.

Figure 3:
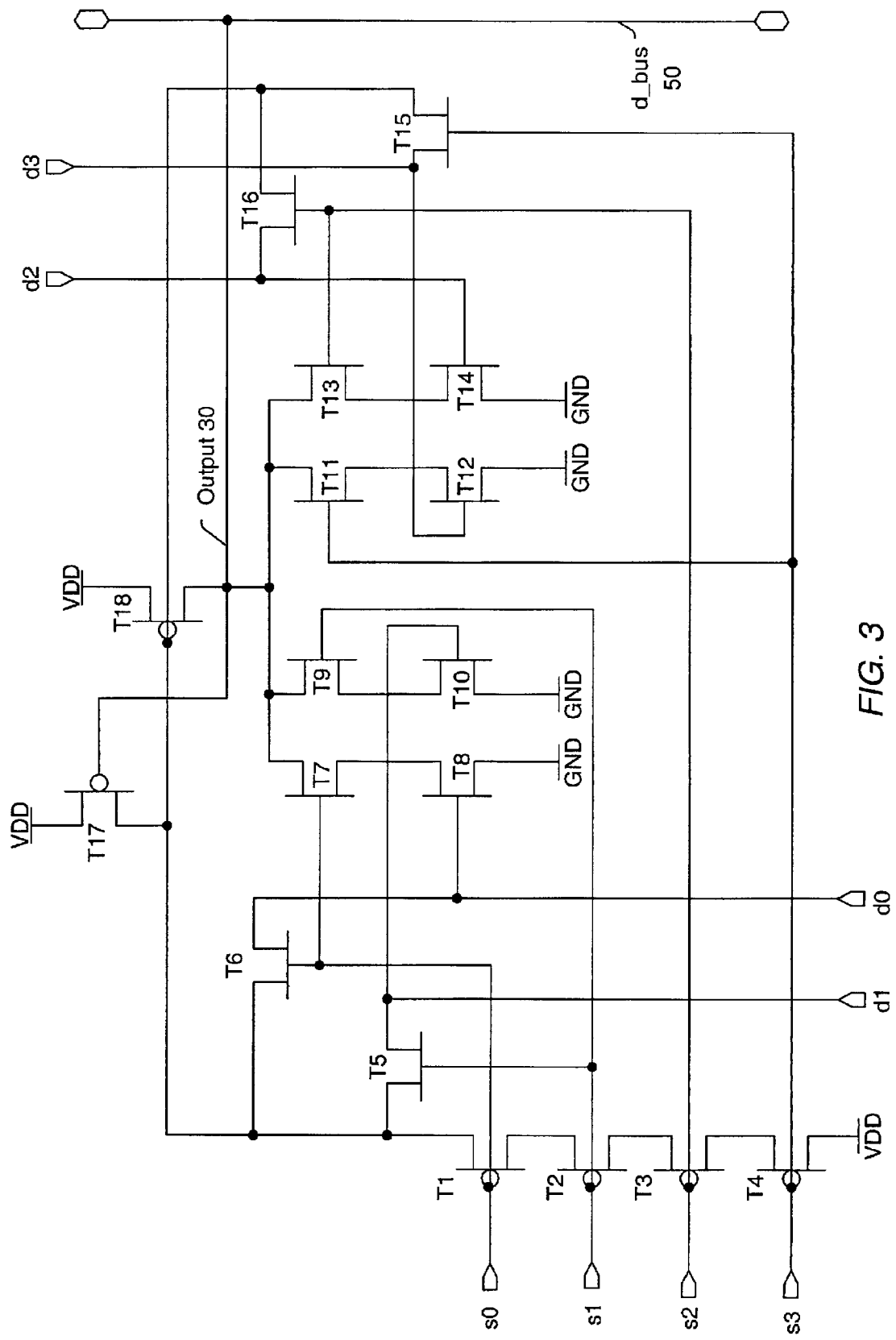
FIG. 3 is a circuit diagram of an alternative embodiment of a four input multiplexer circuit.

Turning now to FIG. 3, a circuit diagram of an alternative embodiment of a four input multiplexer circuit is shown. As will be described in more detail below, the four input multiplexer circuit of FIG. 3 is similar in operation to that of the two input multiplexer circuit described in FIG. 1 with the addition of two select signals s2 and s3, two data input signals d2 and d3 and some additional transistors to accommodate the additional input signals.

Referring back to FIG. 1, P-channel transistors T1, T2, are connected in series and turn off P-channel transistor T10 in the event that neither input signal s0 nor s1 is active. In FIG. 3, P-channel transistors T3 and T4 are added in series with transistors T1 and T2. The four series transistors turn off P-channel transistor T18 when none of the four select signals s0, s1, s2 or s3 is active. Transistor T17 performs the same function as transistor T9 in FIG. 1. N-channel Transistors T5 and T6 of FIG. 3 perform the same operation as transistors N-channel T3 and T4 in FIG. 1. N-channel transistors T7, T8, T9 and T10 of FIG. 3 perform the same operation as N-channel transistors T5–T8 of FIG. 1.

N-channel transistors T11–T14 of FIG. 3 perform a similar operation to that of transistors T7–T9, but they are responsive to data input signals d2 and d3 and select signals s2 and s3. Likewise, N-channel transistors T15 and T16 perform a similar operation to that of transistors T5 and T6, but they are responsive to data input signals d2 and d3 and select signals s2 and s3.

As described above in the description of FIG. 2, the four input multiplexer of FIG. 3 may also be instantiated N times to construct a 4N input multiplexer circuit by connecting the output nodes of each of the four input multiplexers together.

Numerous variations and modifications will become apparent to those skilled in the art once the above disclosure is fully appreciated. It is intended that the following claims be interpreted to embrace all such variations and modifications.

What is claimed is:

1. A multiplexer circuit comprising:

a first circuit coupled to receive at least a first data input and a second data input and at least a first select signal and a second select signal corresponding to said first data input and said second data input, wherein said first circuit is coupled to an output node and is configured to provide an output on said output node responsive to a corresponding one of said first select signal or said second select signal being active; and a tristate circuit coupled to receive said first and said second select signals and coupled to said first circuit, wherein said tristate circuit is configured to prevent said first circuit from providing said output on said output node by presenting a high impedance on said output node responsive to said first select signal and said second select being inactive, said tristate circuit further including a first P-channel transistor and a second P-channel transistor coupled in series, in which said first P-channel transistor is coupled to a supply source and to said second P-channel transistor, said second P-channel transistor is coupled to said first circuit, and said first P-channel transistor and said second P-channel transistor are coupled to be acted by a corresponding one of said first select signal and said second select signal.

2. The multiplexer circuit as recited in claim 1, wherein said first circuit includes:

a first subcircuit coupled to receive said first select signal and said first data input and said second data input, wherein said first subcircuit is configured to output a binary one responsive to receiving a binary zero on either of said first data input and said second data input and a corresponding one of said first select signal or said second select signal being active; and a second subcircuit coupled to receive said first select signal and said second select signal and said first data input and said second data input, wherein said second subcircuit is configured to output a binary zero responsive to receiving a binary one on either of said first data input and said second data input and a corresponding one of said first select signal or said second select signal being active.

3. The multiplexer circuit as recited in claim 2, wherein said first subcircuit includes:

a first N-channel transistor having a first gate terminal, a first terminal and a second terminal, wherein said first gate terminal is coupled to said first select signal and said first terminal is coupled to said first data input;

a second N-channel transistor having a second gate terminal, a third terminal and a fourth terminal, wherein said second gate terminal is coupled to said second select signal and said third terminal is coupled to said second data input, wherein said second N-channel transistor is coupled in parallel to said first N-channel transistor, wherein said fourth terminal is coupled to said second terminal;

a third P-channel transistor having a third gate terminal, a fifth terminal and a sixth terminal, wherein said third gate terminal is coupled to said second terminal and said fourth terminal, wherein said fifth terminal is coupled to a positive supply voltage, wherein said sixth terminal is coupled to said output node;

a fourth P-channel transistor having a fourth gate terminal, a seventh terminal and an eighth terminal, wherein said fourth gate terminal is coupled to said output node, wherein said seventh terminal is coupled to said positive voltage supply voltage, wherein said eighth terminal is coupled to said third gate terminal.

4. The multiplexer circuit as recited in claim 3, wherein said second subcircuit includes:

a third N-channel transistor having a fifth gate terminal, a ninth terminal and a tenth terminal, wherein said fifth gate terminal is coupled to said first select signal, wherein said ninth terminal is coupled to said output node;

a fourth N-channel transistor having a sixth gate terminal, an eleventh terminal and a twelfth terminal, wherein said seventh gate terminal is coupled to said first data input, wherein said eleventh terminal is coupled to ground, wherein said fourth N-channel transistor is coupled in series with said third N-channel transistor, wherein said twelfth terminal is coupled to said tenth terminal;

a fifth N-channel transistor having a seventh gate terminal, a thirteenth terminal and a fourteenth terminal, wherein said sixth gate terminal is coupled to said second select signal, wherein said thirteenth terminal is coupled to said output node;

a sixth N-channel transistor having an eighth gate terminal, a fifteenth terminal and a sixteenth terminal, wherein said eighth gate terminal is coupled to said second data input, wherein said fifteenth terminal is coupled to ground, wherein said sixth N-channel transistor is coupled in series with said fifth N-channel transistor, wherein said sixteenth terminal is coupled to said fourteenth terminal.

5. The multiplexer circuit as recited in claim 1, further comprising:

a second circuit coupled to receive at least a third data input and a fourth data input and at least a third select signal and a fourth select signal corresponding to said third data input and said fourth data input, wherein said second circuit is coupled to said output node and is configured to provide its output on said output node responsive to a corresponding one of said third select signal or said fourth select signal being active; and a second tristate circuit coupled to receive said third and said fourth select signals and coupled to said second circuit, wherein said second tristate circuit is configured to prevent said second circuit from providing its output on said output node by presenting a high impedance on said output node responsive to said third select signal and said fourth select being inactive, said second tristate circuit further including a third P-channel transistor and a fourth P-channel transistor coupled in series, in which said third P-channel transistor is coupled to the supply source and to said fourth P-channel transistor, said fourth P-channel transistor is coupled to said second circuit, and said third P-channel transistor and said fourth P-channel transistor are coupled to a corresponding one of said third select signal and said fourth select signal.

6. A method of operating a multiplexer circuit, said method comprising:

receiving at least a first data input and a second data input;

receiving a first select signal corresponding to selecting said first data input and a second select signal corresponding to selecting said second data input;

providing an output on an output node based on a particular data input selected for output by a corresponding select signal being active; and providing no output on said output node responsive to none of the select signals being active, by presenting a high impedance state on said output node, the high impedance state provided by a first P-channel transistor and a second P-channel transistor coupled in series, in which said first and second P-channel transistors are activated when the first and second select signals are not active to place the output node in the high impedance state.

7. The method as recited in claim 6, wherein said providing an output on the output node includes output of a binary one responsive to receiving a binary zero on either of said first data input or said second data input that is selected by a corresponding active select signal.

8. The method as recited in claim 6, wherein said providing an output on the output node includes output of a binary zero responsive to receiving a binary one on either of said first data input or said second data input that is selected by a corresponding active select signal.

* * * * *

UNITED STATES PATENT AND TRADEMARK OFFICE
CERTIFICATE OF CORRECTION

PATENT NO. : 6,943,589 B2  Page 1 of 1
APPLICATION NO. : 09/859194
DATED : September 13, 2005
INVENTOR(S) : Daniel Dobberpuhl It is certified that error appears in the above-identified patent and that said Letters Patent is hereby corrected as shown below:

Title Page, Item (12): replace "Dobberphul" with --Dobberpuhl--.

Title Page, Item (75): replace "Dobberphul" with --Dobberpuhl--.

Column 6, line 37, in Claim 1: replace "acted" with --gated--.

Column 6, line 42, in Claim 2: after "a first subcircuit coupled to receive said first select signal" insert --and said second select signal--.

Signed and Sealed this

Eleventh Day of November, 2008

JON W. DUDAS
*Director of the United States Patent and Trademark Office*